United States Patent
Lai et al.

(10) Patent No.: US 10,274,817 B2
(45) Date of Patent: Apr. 30, 2019

(54) MASK AND PHOTOLITHOGRAPHY SYSTEM

(71) Applicant: Taiwan Semiconductor Manufacturing Co., Ltd., Hsinchu (TW)

(72) Inventors: Ching-Hung Lai, Hsinchu (TW); Chih-Chung Huang, Hsinchu (TW); Chih-Chiang Tu, Tauyen (TW); Chung-Hung Lin, Tainan (TW); Chi-Ming Tsai, Taipei (TW); Ming-Ho Tsai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/475,137

(22) Filed: Mar. 31, 2017

(65) Prior Publication Data

US 2018/0284595 A1    Oct. 4, 2018

(51) Int. Cl.
*G03F 1/22*    (2012.01)
*G03F 1/36*    (2012.01)
*G03F 7/20*    (2006.01)

(52) U.S. Cl.
CPC .............. *G03F 1/36* (2013.01); *G03F 1/22* (2013.01); *G03F 7/7015* (2013.01); *G03F 7/70441* (2013.01)

(58) Field of Classification Search
CPC . G03F 1/22; G03F 1/36; G03F 7/7015; G03F 7/70441

USPC ............................................................ 430/5
See application file for complete search history.

(56) References Cited

U.S. PATENT DOCUMENTS

| | | | |
|---|---|---|---|
| 7,572,557 B2 * | 8/2009 | Wallace | G03F 1/36 430/311 |
| 8,716,841 B1 | 5/2014 | Chang et al. | |
| 8,736,084 B2 | 5/2014 | Cheng et al. | |
| 8,764,995 B2 | 7/2014 | Chang et al. | |
| 8,796,666 B1 | 8/2014 | Huang et al. | |
| 8,828,625 B2 | 9/2014 | Lu et al. | |
| 8,837,810 B2 | 9/2014 | Chen et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,134,633 B2 | 9/2015 | Lin et al. | |
| 9,184,054 B1 | 11/2015 | Huang et al. | |
| 9,230,867 B2 | 1/2016 | Cheng et al. | |
| 9,256,123 B2 | 2/2016 | Shih et al. | |
| 9,304,403 B2 | 4/2016 | Lin et al. | |
| 9,404,743 B2 | 8/2016 | Chiu et al. | |
| 9,529,268 B2 | 12/2016 | Chang et al. | |
| 9,548,303 B2 | 1/2017 | Lee et al. | |
| 2008/0299773 A1 * | 12/2008 | Watanabe | H01L 21/0273 438/694 |

* cited by examiner

*Primary Examiner* — Christopher G Young
(74) *Attorney, Agent, or Firm* — JCIPRNET

(57) ABSTRACT

A mask includes a transparent substrate, a first pattern, a second pattern, and a sub-resolution auxiliary feature. The first pattern and the second pattern are over the transparent substrate. The first pattern has an area of 0.16 $\mu m^2$ to 60000 $\mu m^2$. The second pattern has an area of 0.16 $\mu m^2$ to 60000 $\mu m^2$. The sub-resolution auxiliary feature is over the transparent substrate and connects the first pattern and the second pattern.

13 Claims, 4 Drawing Sheets

MASK AND PHOTOLITHOGRAPHY SYSTEM

BACKGROUND

In semiconductor fabrication, photomasks are used during photolithography process to render patterns on a semiconductor substrate. However, during the exposure process, the illumination would cause electro-static discharge (ESD) such that charges are accumulated at a certain area of the photomask. As a result, the photomask is damaged and the lifetime thereof is shortened.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
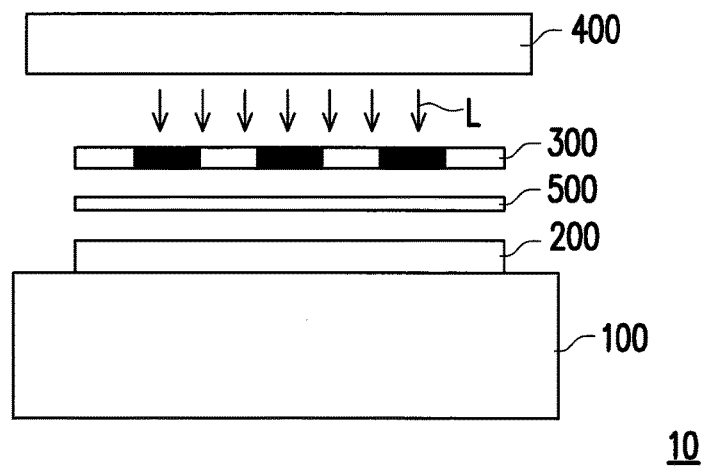
FIG. 1 is a schematic view illustrating a photolithography system.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

FIG. 1 is a schematic view illustrating a photolithography system 10. The photolithography system 10 may be utilized in the fabrication of a variety of semiconductor devices, such as memory devices (including but not limited to a static random access memory (SRAM)), logic devices (including but not limited to a metal-oxide semiconductor field-effect transistor (MOSFET)), and/or other devices.

Referring to FIG. 1, the photolithography system 10 includes a stage 100, a mask 300, and a radiation source 400. As illustrated in FIG. 1, the stage 100 is configured to carry a semiconductor substrate 200. The material of the stage 100 is not limited as long as such material is able to withstand the subsequent processes while carrying the semiconductor substrate 200 disposed thereon. In some embodiments, the semiconductor substrate 200 may include semiconductor wafer. For example, the semiconductor substrate 200 may include an elementary semiconductor material, such as crystal silicon, polycrystalline silicon, amorphous silicon, and/or germanium; a compound semiconductor, such as silicon carbide and/or gallium arsenic; an alloy semiconductor, such as SiGe, GaAsP, AlInAs, AlGaAs, and/or GaInP. In some embodiments, the semiconductor substrate 200 may include a bulk semiconductor, such as bulk silicon. The bulk semiconductor may include an epi silicon layer thereon. In some alternative embodiments, the semiconductor substrate 200 may be a semiconductor-on-insulator substrate, such as a silicon-on-insulator (SOI) substrate, or a thin-film transistor (TFT) substrate. The topmost layer of the semiconductor substrate 200 is the layer to be patterned, and may include dielectric material, conductive material, or semiconductor material depending on the fabrication requirements.

When performing the photolithography process, a photoresist layer (not illustrated) is disposed over the semiconductor substrate 200 by spin-on coating and/or other processes. In some embodiments, a photoresist solution is dispensed onto the surface of the topmost layer of the semiconductor substrate 200. The semiconductor substrate 200 having photoresist solution dispensed thereon is spun rapidly until the photoresist solution is almost dry. In some embodiments, the photoresist layer may be a chemically amplified resist that employs acid catalysis. For example, the photoresist layer may be formulated by dissolving an acid sensitive polymer in a casting solution. In some embodiments, the photoresist layer may be a positive tone photoresist which would render the patterns subsequently formed on the semiconductor wafer 200 having the same contour as the patterns on the mask 300. In some alternative embodiments, the photoresist layer may be a negative tone photoresist which would render the patterns subsequently formed on the semiconductor wafer 200 having openings corresponding to the patterns on the mask 300.

The radiation source 400 is located above the semiconductor substrate 200 and is configured to emit an electromagnetic radiation L for photolithography. In some embodiments, the radiation source 400 may emit ultraviolet light. For example, the radiation source 400 may emit an electromagnetic radiation L having a wavelength ranges between 13.5 nm and 365 nm. In some embodiments, the wavelength of the electromagnetic radiation L may be 13.5 nm, 193 nm, 248 nm, or 365 nm based on the fabrication requirements. It should be noted that the wavelength of the electromagnetic radiation L emitted by the radiation source 400 is not limited to the foregoing values. In some alternative embodiments, the electromagnetic radiation L may be extended to include other radiation beams such as ion beam, x-ray, extreme ultraviolet, deep ultraviolet, and other radiation energy based on the resolution requirements.

The mask 300 is located between the radiation source 400 and the stage 100 carrying the semiconductor substrate 200. In some embodiments, the mask 300 is aligned with the radiation source 400 and the stage 100. Moreover, in some embodiments, the mask 300 may be fixed between the radiation source 400 and the stage 100 by a mask holder (not illustrated). In some embodiments, a thickness of the mask 300 may be approximately 60 mm to 250 mm. The configuration and the layout of the mask 300 will be discussed in greater detail later.

Figure 2:
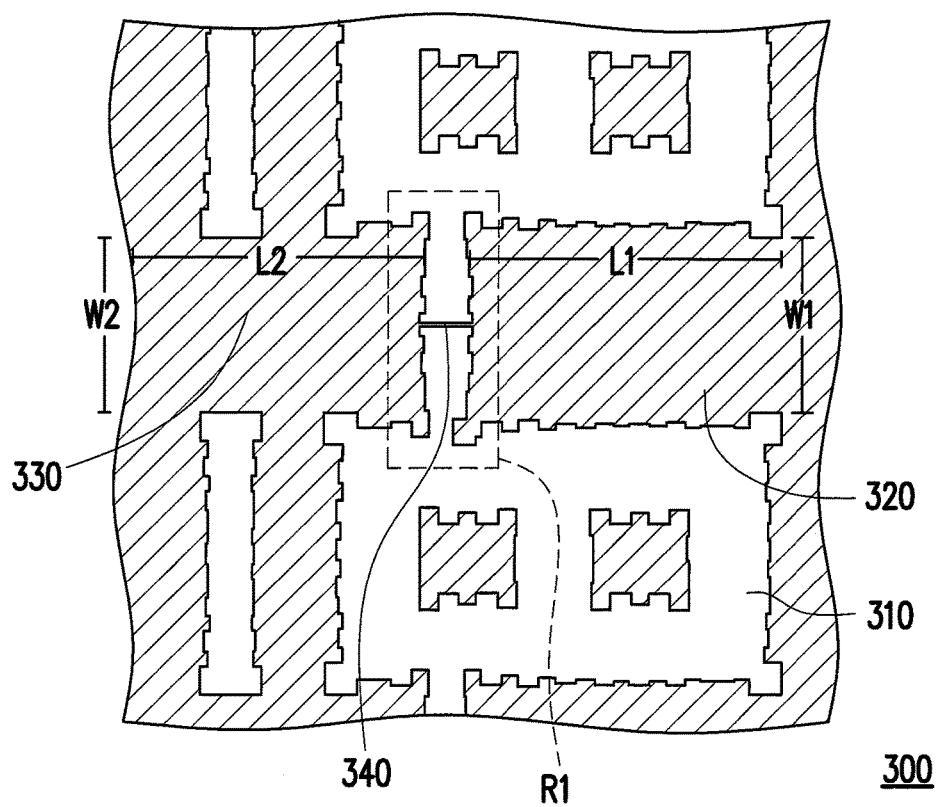
FIG. 2 is a schematic top view illustrating a portion of a mask depicted in FIG. 1 in accordance with some embodiments of the disclosure.

During the photolithography process, the mask 300 is illuminated uniformly by the electromagnetic radiation L emitted from the radiation source 400. At least some part of the electromagnetic radiation L is blocked by the patterns (as illustrated in FIG. 2) of the mask 300 while the other part of the electromagnetic radiation L is transmitted through the mask 300 to arrive at the semiconductor substrate 200. In some embodiments, the electromagnetic radiation L is focused by a projection lens 500 prior to being projected onto the semiconductor substrate 200. Upon irradiation by the electromagnetic radiation L, at least part of the photoresist layer located over the topmost layer of the semiconductor substrate 200 may be softened or hardened depending on the type of the photoresist layer. In some embodiments, the molecules in the photoresist layer are cross-linked to alter the hardness of the photoresist layer. Thereafter, the photoresist layer may be developed by a conventionally known developer to form patterns shielding part of the topmost layer of the semiconductor substrate 200. Subsequently, a wet etch process or a dry etch process may be performed on the topmost layer of the semiconductor substrate 200 to render a plurality of integrated circuit patterns. The remaining photoresist layer may be removed by wet stripping or plasma ashing. It should be noted that the patterns of the mask 300 are larger than the integrated circuit patterns on the semiconductor substrate 200. In other words, the patterns of the mask 300 are shrunk and transferred onto the semiconductor substrate 200.

In some embodiments, the mask 300 is used to fabricate integrated circuit patterns on the semiconductor substrate 200. However, the mask 300 is not limited thereto. In some alternative embodiments, the mask 300 may be used to pattern other substrates such as a glass substrate used to form a thin film transistor liquid crystal display (TFT-LCD) substrate. The details of the mask 300 will be described below.

FIG. 2 is a schematic top view illustrating a portion of the mask 300 depicted in FIG. 1 in accordance with some embodiments of the disclosure. The mask 300 may be a high precision plate containing microscopic images of electronic circuits to be transferred on the semiconductor substrate 200. Referring to FIG. 2, the mask 300 includes a transparent substrate 310, a first pattern 320, a second pattern 330, and a sub-resolution auxiliary feature 340. The transparent substrate 310 includes material substantially free of defects, such as fused silica ($SiO_2$), quartz, calcium fluoride, or other suitable material.

The first pattern 320, the second pattern 330, and the sub-resolution auxiliary feature 340 are formed on one side of the transparent substrate 310. The first pattern 320 and the second pattern 330 may be designed to form a portion of an integrated circuit pattern on the semiconductor substrate 200. In some embodiments, the first pattern 320 and the second pattern 330 may include lines, spaces, holes (e.g., vias), islands, or any other pattern. For example, the first pattern 320 and the second pattern 330 may correspond to a contour of a conductive trace layer, a conductive ball pad, a dielectric layer, or the like in the semiconductor substrate 200. In some embodiments, the first pattern 320 and the second pattern 330 are spaced apart. As illustrated in FIG. 2, the first pattern 320 and the second pattern 330 are connected by the sub-resolution auxiliary feature 340. The first pattern 320, the second pattern 330, and the sub-resolution auxiliary feature 340 are made of, for example, Cr, Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3N$, $Al_2O_3R$, and combinations thereof.

The first pattern 320, the second pattern 330, and the sub-resolution auxiliary feature 340 may be formed by depositing a material layer (not illustrated) including the foregoing material over the transparent substrate 310. Subsequently, a photoresist layer (not illustrated) may be formed over the material layer (over the mask 300). The photoresist layer may be patterned. The patterning of the photoresist layer over the mask 300 may be performed using conventional photolithography processes. In some embodiments, the photolithography process includes soft baking, mask aligning, exposing, baking, developing the photoresist layer, and hard baking. In some alternative embodiments, the patterning process may include electron-beam writing, ion-beam writing, mask-less lithography, and/or molecular imprint. The patterned photoresist layer may create openings exposing part of the material layer. Thereafter, the material layer located in the openings may be removed to form the first pattern 320, the second pattern 330, and the sub-resolution auxiliary feature 340. Since the first pattern 320, the second pattern 330, and the sub-resolution auxiliary feature 340 are formed simultaneously by the same process, the first pattern 320, the second pattern 330, and the sub-resolution auxiliary feature 340 are considered as a same layer and are made of a same material.

Referring to FIG. 2, in some embodiments, a length L1 of the first pattern 320 may range between 20 μm and 300 μm and a width W1 of the first pattern 320 may range between 20 μm and 300 μm. In some embodiments, a length L2 of the second pattern 330 may range between 20 μm and 300 μm and a width W2 of the second pattern 330 may range between 20 μm and 300 μm. An area of the first pattern 320 may range between 600 μm$^2$ to 60000 μm$^2$ and an area of the second pattern 330 may range between 600 μm$^2$ to 60000 μm$^2$. Since the area of the first pattern 320 and the second pattern 330 are relatively large as compared to other patterns located on the mask 300, the first pattern 320 and the second pattern 330 may be referred as bulky patterns. Since the first pattern 320 and the second pattern 330 are spaced apart, an opening may be formed between the first pattern 320 and the second pattern 330. The opening exposes the transparent substrate 310. During the photolithography process of the semiconductor substrate 200, part of the electromagnetic radiation L emitted by the radiation source 400 is blocked by the first pattern 320 and the second pattern 330, and another part of the electromagnetic radiation L is transmitted to the semiconductor substrate 200 through the opening and the transparent substrate 310. In some embodiments, a distance between the first pattern 320 and the second pattern 330 ranges between 50 nm to 150 nm.

Figure 3:
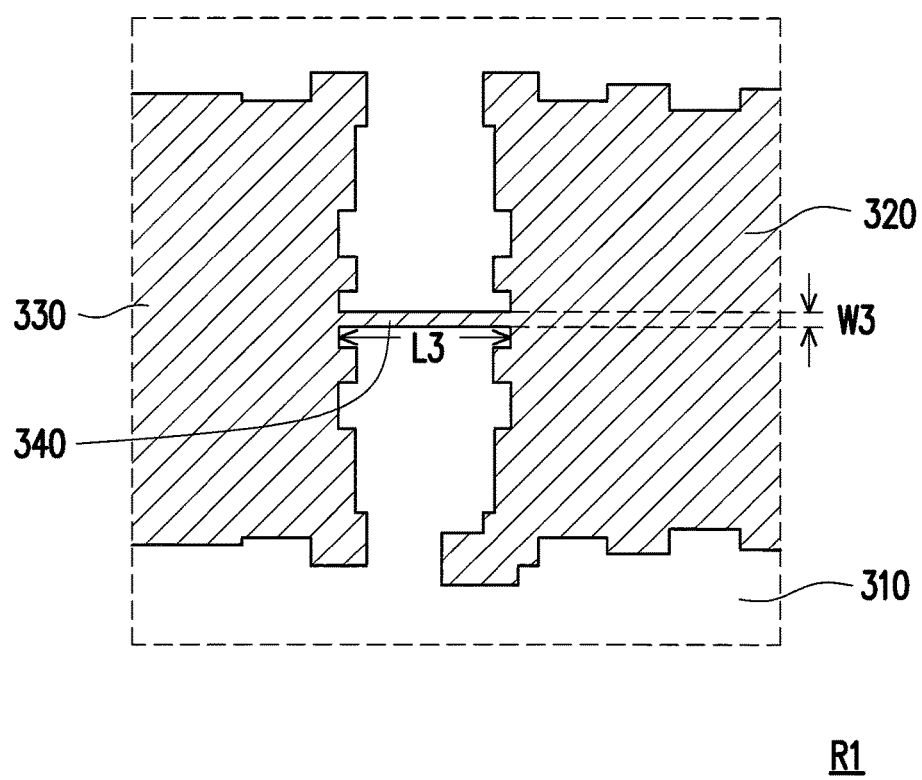
FIG. 3 is an enlarged view of a region depicted in FIG. 2.

FIG. 3 is an enlarged view of a region R1 depicted in FIG. 2. Referring to FIG. 3, the sub-resolution auxiliary feature 340 has a width W3 ranges between 4 nm to 20 nm and a length L3 ranges between 50 nm to 150 nm. In some embodiments, the smaller the wavelength of the electromagnetic radiation L emitted from the radiation source 400 is, the smaller the dimension of the sub-resolution auxiliary feature 340 is. In other words, the dimension of the sub-resolution auxiliary feature 340 depends on the wavelength of the electromagnetic radiation L. Moreover, as mentioned above, the patterns (the first pattern 320 and the second pattern 330) of the mask 300 are shrunk and transferred onto the semiconductor substrate 200 with the aid of the projection lens 500. Therefore, the dimension of the sub-resolution auxiliary feature 340 may also be adjusted based on the lens resolution and/or magnification/minification power. Suitable dimension of the sub-resolution auxiliary feature 340 may be selected based on the photolithography system 10. Since the dimension of the sub-resolution auxiliary feature 340 is extremely small, the sub-resolution auxiliary feature 340 has a dimension less than the resolution limit of the imaging system. In other words, the sub-resolution auxiliary feature 340 is too small to be transferred on the semiconductor substrate 200 due to the limitation in the lens. For example, the patterns transferred onto the semiconductor substrate 200 would not have any region corresponding to the sub-resolution auxiliary feature 340 of the mask 300. Therefore, the sub-resolution auxiliary feature 340 would not affect the contour of the desired pattern to be transferred on the semiconductor substrate 200. During the exposure step of the photolithography process, charges are likely to accumulate at the edges of the bulky patterns (the first pattern 320 and the second pattern 330). However, with the aid of the sub-resolution auxiliary feature 340 connected between the first pattern 320 and the second pattern 330, accumulation of the charges may be alleviated, thereby reducing the electrostatic discharge (ESD) of the mask 300.

Figure 4:
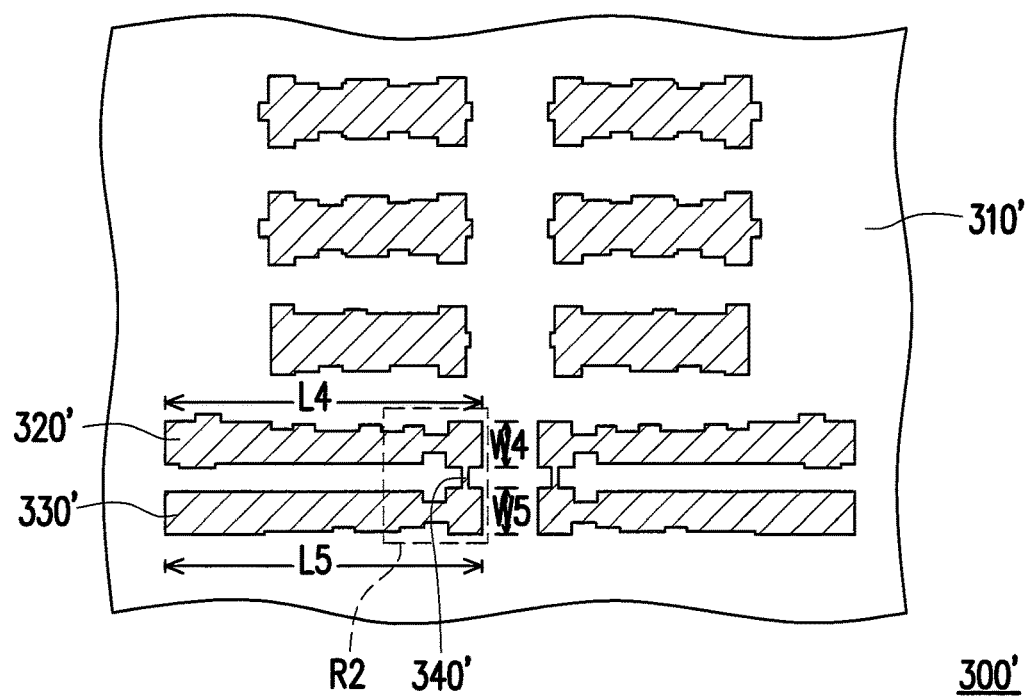
FIG. 4 is a schematic top view illustrating a portion of a mask depicted in FIG. 1 in accordance with some embodiments of the disclosure.

FIG. 4 is a schematic top view illustrating a portion of the mask 300' depicted in FIG. 1 in accordance with some embodiments of the disclosure. Similar to the mask 300, the mask 300' is also a high precision plate containing microscopic images of electronic circuits. Referring to FIG. 4, the mask 300' includes a transparent substrate 310', a first pattern 320', a second pattern 330', and a sub-resolution auxiliary feature 340'. The transparent substrate 310' includes material substantially free of defects, such as fused silica ($SiO_2$), quartz, calcium fluoride, or other suitable material.

The first pattern 320', the second pattern 330', and the sub-resolution auxiliary feature 340' are formed on one side of the transparent substrate 310'. The first pattern 320' and the second pattern 330' may be designed to form a portion of an integrated circuit pattern on the semiconductor substrate 200. In some embodiments, the first pattern 320' and the second pattern 330' may include lines, spaces, holes (e.g., vias), islands, or any other pattern. For example, the first pattern 320' and the second pattern 300' may correspond to a contour of a conductive trace layer, a conductive ball pad, a dielectric layer, or the like in the semiconductor substrate 200. In some embodiments, the first pattern 320' and the second pattern 330' are spaced apart and are connected by the sub-resolution auxiliary feature 340'. The first pattern 320', the second pattern 330', and the sub-resolution auxiliary feature 340' are made of, for example, Cr, Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3N$, $Al_2O_3R$, and combinations thereof.

The first pattern 320', the second pattern 330', and the sub-resolution auxiliary feature 340 may be formed by depositing a material layer (not illustrated) including the foregoing material over the transparent substrate 310'. Subsequently, a patterned photoresist layer (not illustrated) may be formed over the material layer (over the mask 300'). The photoresist layer over the mask 300' may be patterned by conventional photolithography processes. In some embodiments, the photolithography process includes soft baking, mask aligning, exposing, baking, developing the photoresist layer, and hard baking. In some alternative embodiments, the patterning process may include electron-beam writing, ion-beam writing, mask-less lithography, and/or molecular imprint. The patterned photoresist layer may create openings exposing part of the material layer so that part of the material layer located in the openings may be removed to form the first pattern 320', the second pattern 330', and the sub-resolution auxiliary feature 340'. Since the first pattern 320', the second pattern 330', and the sub-resolution auxiliary feature 340' are formed simultaneously by the same process, the first pattern 320', the second pattern 330', and the sub-resolution auxiliary feature 340' are considered as a same layer and are made of a same material.

Referring to FIG. 4, in some embodiments, a length L4 of the first pattern 320' may range between 8 μm and 800 μm and a width W4 of the first pattern 320' may range between 20 nm and 100 nm. On the other hand, a length L5 of the second pattern 330' may range between 8 μm and 800 μm and a width W5 of the second pattern 330' may range between 20 nm and 100 nm. An area of the first pattern 320' may range between 0.16 $\mu m^2$ to 80 $\mu m^2$ and an area of the second pattern 330' may range between 0.16 $\mu m^2$ to 80 $\mu m^2$. In some embodiments, the first pattern 320' has a length to width ratio (L/W) of 80:1 to 40000:1 and the second pattern 330' has a length to width ratio (L/W) of 80:1 to 40000:1. Since the aspect ratio (length to width ratio) of the first pattern 320' and the second pattern 330' is large, the first pattern 320' and the second pattern 330' may be referred as stripped patterns, as illustrated in FIG. 4. As mentioned above, the first pattern 320' and the second pattern 330' are spaced apart to form an opening therebetween. The opening exposes the transparent substrate 310'. During the photolithography process of the semiconductor substrate 200, part of the electromagnetic radiation L emitted by the radiation source 400 is blocked by the first pattern 320' and the second pattern 330', and another part of the electromagnetic radiation L is transmitted to the semiconductor substrate 200 through the opening and the transparent substrate 310'.

Figure 5:
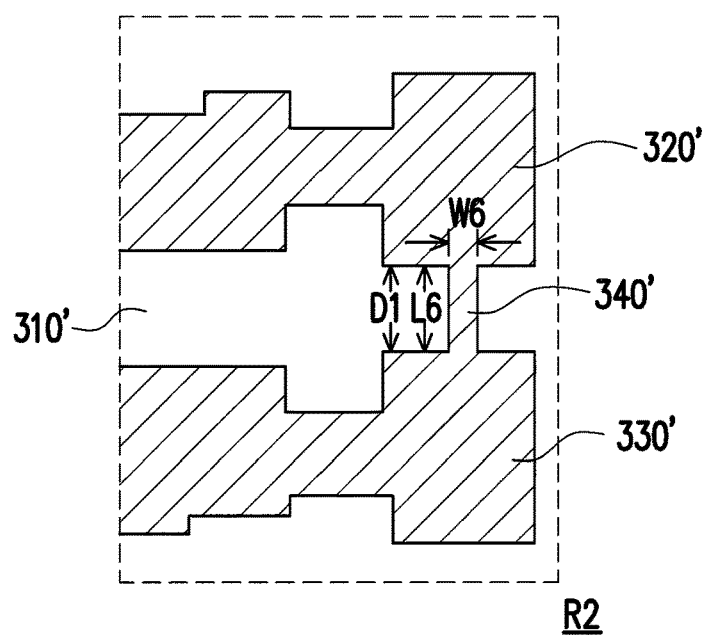
FIG. 5 is an enlarged view of a region depicted in FIG. 4.

FIG. 5 is an enlarged view of a region R2 depicted in FIG. 4. Referring to FIG. 5, the sub-resolution auxiliary feature 340' connects an end of the first pattern 320' and an end of the second pattern 330'. The sub-resolution auxiliary feature 340' has a width W6 ranges between 4 nm to 20 nm and a length L6 ranges between 20 nm to 150 nm. In some embodiments, the first pattern 320' and the second pattern 330' have a minimum distance D1 therebetween. For example, as illustrated in FIG. 5, the first pattern 320' and the second pattern 330' respectively exhibit a hammer head shape. Under this circumstance, the minimum distance D1 is found between ends of the first pattern 320' and the second pattern 330'. In some embodiments, the minimum distance D1 ranges between 20 nm to 150 nm. The length L6 of the sub-resolution auxiliary feature 340' may be substantially equal to the minimum distance D1 between the first pattern 320' and the second pattern 330', so as to ensure the miniaturization of the sub-resolution auxiliary feature 340'. It should be noted that the configuration illustrated in FIG.

5 merely serves as an exemplary embodiment, and the location of the sub-resolution auxiliary feature 340' is not limited thereto. In some alternative embodiments, the sub-resolution auxiliary feature 340' may adapt other configurations as long as the sub-resolution auxiliary feature 340' connects the first pattern 320' and the second pattern 330'. For example, the sub-resolution auxiliary feature 340' may be connected between a body portion of the first pattern 320' and a body portion of the second pattern 330'. Alternatively, the sub-resolution auxiliary feature 340' may be connected between the end of the first pattern 320' and the body portion of the second pattern 330'.

In some embodiments, the smaller the wavelength of the electromagnetic radiation L emitted from the radiation source 400 is, the smaller the dimension of the sub-resolution auxiliary feature 340' is. In other words, the dimension of the sub-resolution auxiliary feature 340' depends on the wavelength of the electromagnetic radiation L. Moreover, as mentioned above, the patterns (the first pattern 320' and the second pattern 330') of the mask 300' are shrunk and transferred onto the semiconductor substrate 200 with the aid of projection lens 500. Therefore, the dimension of the sub-resolution auxiliary feature 340' may also be adjusted based on the lens resolution and/or magnification/minification power. Suitable dimension of the sub-resolution auxiliary feature 340' may be selected based on the photolithography system 10. Since the dimension of the sub-resolution auxiliary feature 340' is extremely small, the sub-resolution auxiliary feature 340' has a dimension less than the resolution limit of the imaging system. In other words, the sub-resolution auxiliary feature 340' is too small to be transferred on the semiconductor substrate 200 due to the limitation in the lens. For example, the patterns transferred onto the semiconductor substrate 200 would not have any region corresponding to the sub-resolution auxiliary feature 340' of the mask 300'. Therefore, the sub-resolution auxiliary feature 340' would not affect the contour of the desired pattern to be transferred on the semiconductor substrate 200. During the exposure step of the photolithography process, charges are likely to accumulate at the edges of the stripped patterns (the first pattern 320' and the second pattern 330'). However, with the aid of the sub-resolution auxiliary feature 340' connected between the first pattern 320' and the second pattern 330', accumulation of the charges may be alleviated, thereby reducing the electro-static discharge (ESD) of the mask 300'.

Figure 6:
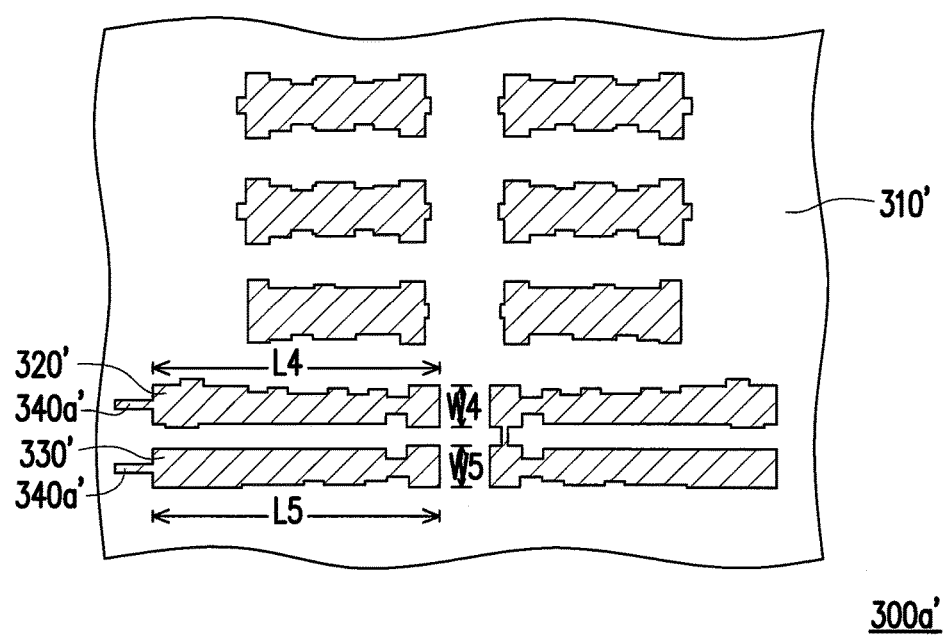
FIG. 6 is a schematic top view illustrating a portion of a mask depicted in FIG. 1 in accordance with some embodiments of the disclosure.

FIG. 6 is a schematic top view illustrating a portion of a mask 300a' depicted in FIG. 1 in accordance with some embodiments of the disclosure. The embodiment of FIG. 6 is similar to the embodiment of FIGS. 4-5, so similar elements are denoted by the same reference numeral and detail descriptions thereof are omitted herein. The difference between the embodiment of FIG. 6 and the embodiment of FIGS. 4-5 lies in that in the embodiment of FIG. 6, the sub-resolution auxiliary features 340a' are not connected between the first pattern 320' and the second pattern 340'. Instead, the sub-resolution auxiliary features 340a' extend from ends of the first pattern 320' and the second pattern 340'. In some embodiments, the sub-resolution auxiliary feature 340a' may serve as a sacrifice element. For example, due to the stripped configuration of the sub-resolution auxiliary feature 340a', the charge are likely to accumulate near the sub-resolution auxiliary feature 340a'. However, as mentioned above, the sub-resolution auxiliary feature 340a' does not contribute to the patterns transferred onto the semiconductor substrate 200. Therefore, the charges may be accumulate near the sub-resolution auxiliary feature 340a' such that the charge accumulation near the first pattern 320' and the second pattern 330' are alleviated. Thus, the patterns (the first pattern 320' and the second pattern 330') transferred onto the semiconductor substrate 200 remain unaffected, and the lifetime of the mask 300a' may be extended.

In accordance with some embodiments of the present disclosure, a mask includes a transparent substrate, a first pattern, a second pattern, and a sub-resolution auxiliary feature. The first pattern and the second pattern are over the transparent substrate. The first pattern has an area of 0.16 $\mu m^2$ to 60000 $\mu m^2$, and the second pattern has an area of 0.16 $\mu m^2$ to 60000 $\mu m^2$. The sub-resolution auxiliary feature is over the transparent substrate and connects the first patter and the second pattern.

In accordance with some embodiments of the present disclosure, a mask includes a transparent substrate, a first pattern, a second pattern, and a sub-resolution auxiliary feature. The first pattern and the second pattern are over the transparent substrate and are spaced apart. The first pattern has a length to width ratio (L/W) of 80:1 to 40000:1 and the second pattern has a length to width ratio (L/W) of 80:1 to 40000:1. The sub-resolution auxiliary feature is over the transparent substrate and connects the first pattern and the second pattern.

In accordance with some embodiments of the present disclosure, a photolithography system includes a radiation source, a stage, and a mask. The radiation source is configured to emit an electromagnetic radiation. The stage is configured to carry a semiconductor substrate. The stage is located below the radiation source. The mask is located between the radiation source and the stage. The mask includes a transparent substrate, a first pattern, a second pattern, and a sub-resolution auxiliary feature. The first pattern and the second pattern are over the transparent substrate. The sub-resolution auxiliary feature is over the transparent substrate and connects the firs pattern and the second pattern.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A mask, comprising:
a transparent substrate;
a first pattern and a second pattern over the transparent substrate, wherein the first pattern has an area of 0.16 $\mu m^2$ to 60000 $\mu m^2$, and the second pattern has an area of 0.16 $\mu m^2$ to 60000 $\mu m^2$; and
a sub-resolution auxiliary feature over the transparent substrate, wherein the sub-resolution auxiliary feature connects the first pattern and the second pattern, a width of the sub-resolution auxiliary feature ranges between 4 nm and 20 nm, and a length of the sub-resolution auxiliary feature ranges between 50 nm and 150 nm.

2. The mask according to claim 1, wherein the transparent substrate comprises a quartz material.

3. The mask according to claim 1, wherein the first pattern, the second pattern, and the sub-resolution auxiliary feature are made of a same material.

4. The mask according to claim 1, wherein the first pattern, the second pattern, and the sub-resolution auxiliary feature are made of a same layer.

5. The mask according to claim 1, wherein the first pattern, the second pattern, and the sub-resolution auxiliary feature comprise Cr, Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3N$, $Al_2O_3R$, and combinations thereof.

6. The mask according to claim 1, wherein the first pattern and the second pattern are spaced apart.

7. The mask according to claim 1, wherein the first pattern and the second pattern are bulky patterns.

8. The mask according to claim 1, wherein the first pattern and the second pattern are stripped patterns.

9. The mask according to claim 1, wherein a ratio of the area of the first pattern to an area of the sub-resolution auxiliary feature ranges between 53.3:1 and 300000000:1, and a ratio of the area of the second pattern to the area of the sub-resolution auxiliary feature ranges between 53.3:1 and 300000000:1.

10. A photolithography system, comprising:
a radiation source, configured to emit an electromagnetic radiation;
a stage, configured to carry a semiconductor substrate, wherein the stage is located below the radiation source; and
a mask, located between the radiation source and the stage, wherein the mask comprises:
a transparent substrate;
a first pattern and a second pattern over the transparent substrate, wherein the first pattern has an area of 0.16 $\mu m^2$ to 60000 $\mu m^2$, and the second pattern has an area of 0.16 $\mu m^2$ to 60000 $\mu m^2$; and
a sub-resolution auxiliary feature over the transparent substrate, wherein the sub-resolution auxiliary feature connects the first pattern and the second pattern, a width of the sub-resolution auxiliary feature ranges between 4 nm and 20 nm, and a length of the sub-resolution auxiliary feature ranges between 50 nm and 150 nm.

11. The photolithography system according to claim 10, wherein a wavelength of the electromagnetic radiation ranges between 13.5 nm and 365 nm.

12. The photolithography system according to claim 10, wherein the area of the first pattern ranges between 600 $nm^2$ and 60000 $nm^2$, and the area of the second pattern ranges between 600 $nm^2$ and 60000 $nm^2$.

13. The photolithography system according to claim 10, wherein a length to width ratio (L/W) of the first pattern ranges between 80:1 and 40000:1, and a length to width ratio (L/W) of the second pattern ranges between 80:1 and 40000:1.

* * * * *